United States Patent

[11] 3,615,945

[72] Inventor Masami Yokozawa
Osaka, Japan
[21] Appl. No. 832,281
[22] Filed June 11, 1969
[45] Patented Oct. 26, 1971
[73] Assignee Matsushita Electronics Corporation
Osaka, Japan
[32] Priority June 21, 1968
[33] Japan
[31] 43/53043

[54] METHOD OF MAKING SEMICONDUCTOR DEVICES
12 Claims, 2 Drawing Figs.

[52] U.S. Cl. .......... 148/190, 148/186, 148/189
[51] Int. Cl. .......... H01l 7/44
[50] Field of Search .......... 148/186, 187, 188, 189, 190

[56] References Cited

UNITED STATES PATENTS 3,041,213 6/1962 Anderson et al .......... 148/190

*Primary Examiner*—L. Dewayne Rutledge
*Assistant Examiner*—R. A. Lester
*Attorney*—Craig, Antonelli, Stewart & Hill

ABSTRACT: A deep aluminum-diffused P-type layer and a shallow-diffused layer of a preselected conductivity type are simultaneously diffused into a semiconductor substrate by a double diffusion process which employs a composite impurity source. The composite impurity source consists of an aluminum receptacle having a predetermined amount of at least one shallow diffusing, conductivity type determining impurity enclosed therein. The receptacle may be fabricated from a uniformly thick aluminum foil and the shallow diffusing impurity may consist of, for example, boron, phosphorus, indium and/or antimony.

PATENTED OCT 26 1971 3,615,945

INVENTOR
MASAMI YOKOZAWA

BY
Craig, Antonelli, Stewart & Hill

ATTORNEYS

METHOD OF MAKING SEMICONDUCTOR DEVICES

BACKGROUND OF THE INVENTION

This invention relates to a method of making semiconductor devices having double diffusion layers and to the impurity sources employable therewith. More particularly, this invention relates to a method of producing semiconductor substrates having a deep aluminum-diffused P-type layer and a shallow diffused layer of a preselected conductivity type, and two composite aluminum containing impurity sources therefor.

In the fabrication of semiconductor devices, it is conventional to employ the so-called gas-state diffusion process, wherein heated semiconductor wafers or substrates are exposed to the vapors of one or more conductivity type determining impurities, such as, for example, boron, phosphorus or aluminum. Typically, when aluminum is employed as a P-type impurity, it is desirable to simultaneously diffuse another impurity, such as boron or phosphorus, into the substrate. This is particularly true when, for example, layers differing in impurity concentration are desired at the surface of the substrate and at a predetermined distance below the surface. Thus, by simultaneously diffusing aluminum and boron, for example, a semiconductor substrate having a relatively deep aluminum-diffused P-type layer and a relatively shallow boron-diffused $P^+$-type layer is obtained. Similarly, when aluminum and phosphorus are simultaneously diffused, a substrate having a deep aluminum-diffused P-type layer and a shallow phosphorus-diffused N-type layer is obtained.

One prior art technique for simultaneously diffusing aluminum and another impurity, such as boron, into a semiconductor substrate comprises heating a substrate in a suitable diffusion chamber together with a small lump of aluminum contained in a receptacle or enclosure along with the other impurity. In another alternative technique, a semiconductor substrate is provided with a vacuum-deposited coating of aluminum, whereafter the aluminum-coated substrate is heated in a diffusion chamber together with the other impurity.

Although the above double diffusion techniques are operative, the former requires the individual weighing and insertion of the aluminum and the other impurity into a suitable diffusion chamber, while the latter requires a preliminary aluminum deposition step. As a consequence of the excess handling steps normally required by conventional double diffusing techniques, it has been difficult to accurately control the amount of the impurity diffused into a substrate.

SUMMARY OF THE INVENTION

In view of the foregoing, it is an object of the present invention to provide a simple and economic method of making semiconductor devices having double diffusion layers which avoid the difficulties and deficiencies of the prior art.

Another object of the present invention is to provide a method for simultaneously diffusing aluminum and another impurity into a semiconductor wafer in a simplified manner.

Yet another object is to provide a new and improved composite impurity source suitable for use in a double diffusion process.

In accordance with the present invention, these and other objects are accomplished by simultaneously diffusing aluminum and another conductivity type determining impurity into the surface of a semiconductor substrate from a heated composite impurity source consisting of an aluminum receptacle or enclosure and at least one conductivity type determining impurity enclosed in the receptacle.

The aluminum receptacle is preferably made of a thin piece of aluminum foil having a uniform, predetermined thickness so that the weight of the aluminum receptacle made therefrom may be readily determined and controlled by employing a piece of foil having a preselected area.

The conductivity type determining impurity which is enclosed in the aluminum receptacle may comprise either a donor or an acceptor impurity. Thus, when the enclosed impurity is one which imparts an acceptor level to the semiconductor substrate, a deep aluminum-diffused layer of P-type and a shallow $P^+$-type layer, heavily diffused with the enclosed acceptor impurity, are simultaneously formed. On the other hand, when the enclosed impurity is one which imparts a donor level to the semiconductor substrate, a deep aluminum-diffused layer of P-type and a shallow N-type layer, heavily diffused with the enclosed donor impurity, are simultaneously formed.

BRIEF DESCRIPTION OF THE DRAWING

The invention will be more fully understood by reference to the following detailed description of the specific embodiments thereof taken in conjunction with the drawing, wherein.

DETAILED DESCRIPTION

Figure 1:
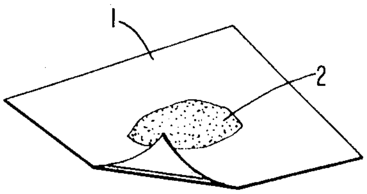
FIG. 1 is a schematic perspective view of a piece of aluminum foil having a conductivity type determining impurity disposed thereon, prior to being wrapped into a composite impurity source.

Referring first to FIG. 1, there is shown a piece of aluminum foil 1 having a preselected weight. The foil 1 is prepared from a larger sheet or foil of aluminum (not shown) having a uniform, preselected thickness so that the weight of the piece of aluminum foil 1 is determined by the area thereof. After the aluminum foil 1 is cut from the larger sheet of aluminum, a preselected weight of another conductivity type impurity 2, such as boron-doped silicon powder, is placed therein and the foil 1 is wrapped to enclose the impurity 2 therein. The wrapped impurity containing aluminum receptacle or enclosure 1′ provides an easy-to-handle composite impurity source. In this manner, the two kinds of impurities can be easily as well as precisely weighed.

Figure 2:
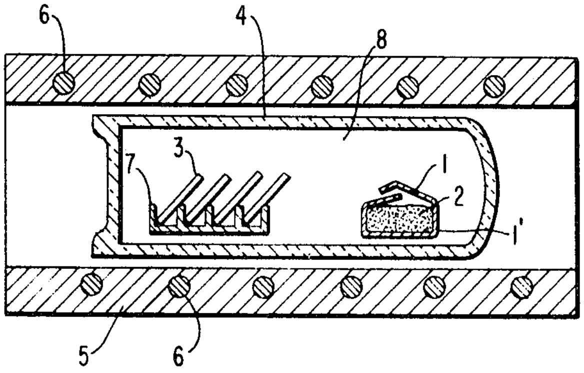
FIG. 2 is a cross-sectional, elevational view of an electric furnace for heating a diffusion chamber in accordance with the present invention.

Next, as shown in FIG. 2, the composite impurity source 1′ is placed in a vacuum space 8 of a suitable diffusion chamber such as a quartz tube 4, which contains semiconductor wafers, such as silicon wafers 3. The silicon wafers 3 are disposed on a hanger 7 in the vacuum space 8. When the quartz tube 4 is heated at a temperature of about 1150° C. for 2 hours in an electric furnace 5 having heater elements 6, the impurities in the composite impurity source 1′ are vaporized and diffused into the silicon wafers 3. In this manner, both impurities, i.e., aluminum and boron, simultaneously diffuse into each silicon wafer 3, forming double diffusion layers consisting of a deep aluminum-diffused P-type layer and a shallow boron-diffused $P^+$-type layer. The deep aluminum-diffused P-type layer has a concentration of about $10^{16}$ atoms/cm.$^3$ and has its diffusion front at a depth of about $20\mu$ from the surface of the wafer 3, while the boron-diffused $P^+$-type layer has a concentration of about $10^{19}$ atoms/cm.$^3$ and has its diffusion front at a depth of about $10\mu$ from the surface.

In another embodiment, the enclosed impurity material 2 comprises a donor-containing material, such as phosphorus-doped silicon powder, and the simultaneously formed double diffusion layers consist of a deep aluminum-diffused P-type layer and a shallow phosphorous-diffused N-type layer formed in the semiconductor wafers 3.

It is to be understood that the above-described embodiments are merely illustrative of the present invention, and that various modifications are contemplated. For example, in accordance with the present invention, a semiconductor substrate having a $P^+$-P-N conductivity type profile can be made when a preliminarily N-type semiconductor substrate of group IV, such as silicon or germanium, is doped with a composite impurity source consisting of an aluminum receptacle 1′ and an enclosed acceptor impurity element such as indium or gallium, each belonging to group III of the elements. Similarly, a semiconductor substrate having an N-P-N-conductivity type can be made by doping a preliminarily N-type semiconductor substance with an aluminum receptacle containing an enclosed donor type impurity material such as arsenic, phosphorus or antimony, each belonging to group V of the elements.

What is claimed is:

1. A method of simultaneously diffusing at least two conductivity type impurities into a semiconductor substrate, which comprises the steps of:

enclosing a first conductivity type determining impurity in an aluminum receptacle, said receptacle constituting a second impurity;

heating the combination thus obtained to vaporize said first and second impurities; and exposing the substrate to the vaporized impurities to simultaneously diffuse said first and second impurities into said substrate.

2. The method according to claim 1, wherein said aluminum receptacle is fabricated from an aluminum foil having a substantially uniform preselected thickness such that the weight of said foil is directly proportional to the area thereof, and wherein said first impurity is enclosed in said aluminum foil.

3. The method according to claim 1, wherein said first impurity is P-type.

4. The method according to claim 2, wherein said first impurity is P-type.

5. The method according to claim 1, wherein said first impurity is N-type.

6. The method according to claim 2, wherein said first impurity is N-type.

7. A method of double diffusing a semiconductor, which comprises heating said substrate in the presence of a composite impurity source, said composite impurity source consisting of a first conductivity type determining impurity enclosed in an aluminum receptacle.

8. The method according to claim 7, wherein said first conductivity type determining impurity is P-type.

9. The method according to claim 7, wherein said first conductivity type determining impurity is N-type.

10. A method of simultaneously diffusing at least two conductivity type determining impurities into a semiconductor substrate, which comprises the steps of:

enclosing a predetermined amount of a first conductivity type determining impurity in an aluminum receptacle having a predetermined weight, said receptacle, together with said first impurity, constituting a composite impurity source; and heating said composite impurity source in the presence of the semiconductor substrate to simultaneously form a deep aluminum-diffused layer and a shallow diffused layer having a conductivity type determined by said first impurity.

11. The method according to claim 10, wherein said substrate is N-type and said first impurity is P-type.

12. The method according to claim 10, wherein both said substrate and said first impurity are N-type.

* * * * *